(12) United States Patent
Varnica et al.

(10) Patent No.: US 9,214,964 B1
(45) Date of Patent: Dec. 15, 2015

(54) SYSTEMS AND METHODS FOR CONFIGURING PRODUCT CODES FOR ERROR CORRECTION IN A HARD DISK DRIVE

(71) Applicant: Marvell International Ltd., Hamilton (BM)

(72) Inventors: Nedeljko Varnica, San Jose, CA (US); Gregory Burd, San Jose, CA (US); Panu Chaichanavong, Bangkok (TH)

(73) Assignee: Marvell International Ltd., Hamilton (BM)

( * ) Notice: Subject to any disclaimer, the term of this patent is extended or adjusted under 35 U.S.C. 154(b) by 90 days.

(21) Appl. No.: 14/031,622

(22) Filed: Sep. 19, 2013

Related U.S. Application Data

(60) Provisional application No. 61/704,919, filed on Sep. 24, 2012, provisional application No. 61/704,897, filed on Sep. 24, 2012.

(51) Int. Cl.
*H03M 13/29* (2006.01)
*H03M 13/53* (2006.01)
*G06F 11/10* (2006.01)

(52) U.S. Cl.
CPC ...... *H03M 13/2909* (2013.01); *H03M 13/2957* (2013.01); *G06F 11/1076* (2013.01)

(58) Field of Classification Search
CPC . H03M 13/2957; H03M 13/43; H03M 13/29; H03M 13/2909; G11B 20/1833; G06F 11/1076; G06F 11/1008; H04L 1/0045
See application file for complete search history.

(56) References Cited

U.S. PATENT DOCUMENTS

| | | | |
|---|---|---|---|
| 5,703,887 A | 12/1997 | Heegard et al. | |
| 5,832,310 A | 11/1998 | Morrissey et al. | |
| 6,185,063 B1 | 2/2001 | Cameron | |
| 6,442,705 B1 | 8/2002 | Lamberts | |
| 6,549,362 B1 | 4/2003 | Melrose et al. | |
| 6,697,209 B2 | 2/2004 | Hughes et al. | |
| 6,724,702 B2 | 4/2004 | Taguchi et al. | |
| 6,862,155 B2 | 3/2005 | Yang et al. | |
| 6,963,528 B2 | 11/2005 | Ogura | |
| 7,082,007 B2 | 7/2006 | Liu et al. | |
| 7,126,890 B2 | 10/2006 | Learned et al. | |
| 7,209,305 B2 | 4/2007 | Chan et al. | |
| 7,218,665 B2 | 5/2007 | McElwain | |
| 7,356,752 B2 * | 4/2008 | Hewitt et al. | 714/755 |
| 7,423,828 B2 | 9/2008 | Emo et al. | |
| 7,457,075 B2 | 11/2008 | Liu et al. | |
| 7,567,397 B2 | 7/2009 | Lu | |
| 7,768,729 B2 | 8/2010 | Moser et al. | |

(Continued)

*Primary Examiner* — April Y Blair
*Assistant Examiner* — Dipakkumar Gandhi
(74) *Attorney, Agent, or Firm* — Ropes & Gray LLP

(57) ABSTRACT

Systems and methods are provided for using a product code having a first dimension and a second dimension to encode data, decode data, or both. An encoding method includes receiving a portion of user data to be written in the first dimension, and computing first parity symbols with respect to the first dimension for the portion of user data. Partial parity symbols with respect to the second dimension are computed for the portion of user data and are used to obtain second parity symbols for the portion of user data. A decoding method includes decoding a first codeword in the first dimension. When the decoding the first codeword in the first dimension is successful, a target syndrome of a second codeword in the second dimension is computed based on a result of the decoding of the first codeword, wherein the first codeword partially overlaps with the second codeword.

18 Claims, 11 Drawing Sheets

(56) References Cited

U.S. PATENT DOCUMENTS

| | | |
|---|---|---|
| 7,965,465 B2 | 6/2011 | Sanvido et al. |
| 7,982,994 B1 | 7/2011 | Erden et al. |
| 8,014,097 B1 | 9/2011 | Sanvido |
| 8,125,723 B1 | 2/2012 | Nichols et al. |
| 8,139,301 B1 | 3/2012 | Li et al. |
| 8,259,409 B2 | 9/2012 | Braganca et al. |
| 8,300,339 B1 | 10/2012 | Nangare et al. |
| 8,441,750 B1 | 5/2013 | Nangare et al. |
| 8,599,508 B1 | 12/2013 | Burd |
| 8,625,215 B1 | 1/2014 | Burd et al. |
| 8,638,513 B1 | 1/2014 | Burd |
| 8,638,522 B2 | 1/2014 | Matsuo et al. |
| 8,837,074 B1 | 9/2014 | Burd et al. |
| 2001/0052104 A1 | 12/2001 | Xu et al. |
| 2003/0033570 A1* | 2/2003 | Khannanov et al. .......... 714/755 |
| 2003/0218955 A1 | 11/2003 | Isshiki et al. |
| 2006/0179400 A1* | 8/2006 | Qian et al. .................... 714/784 |
| 2007/0074083 A1 | 3/2007 | Olds et al. |
| 2007/0177292 A1 | 8/2007 | Bui et al. |
| 2007/0192666 A1* | 8/2007 | Song et al. .................... 714/780 |
| 2008/0055122 A1 | 3/2008 | Tan |
| 2008/0151704 A1 | 6/2008 | Harada |
| 2008/0174905 A1 | 7/2008 | Ueda |
| 2008/0244356 A1 | 10/2008 | Bliss et al. |
| 2008/0244359 A1 | 10/2008 | Li et al. |
| 2010/0218066 A1* | 8/2010 | Okamura et al. .............. 714/752 |
| 2011/0209026 A1 | 8/2011 | Xia et al. |
| 2012/0060073 A1 | 3/2012 | Itakura et al. |

* cited by examiner

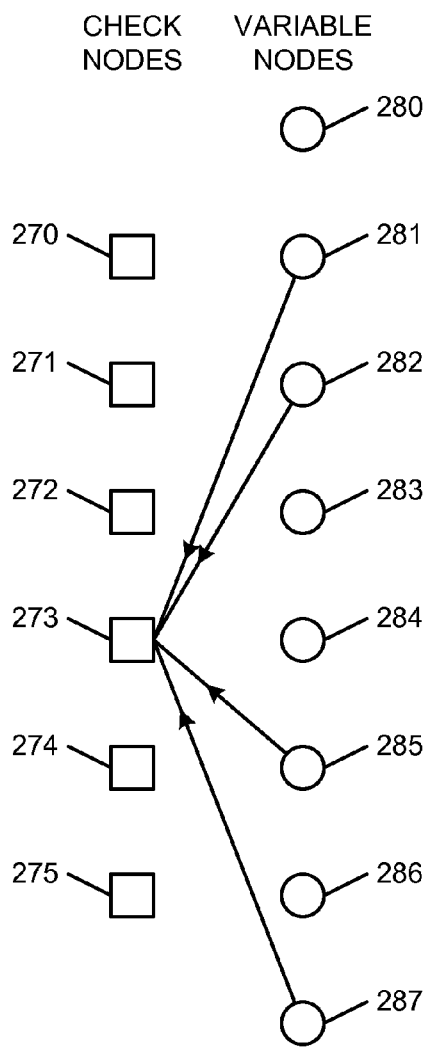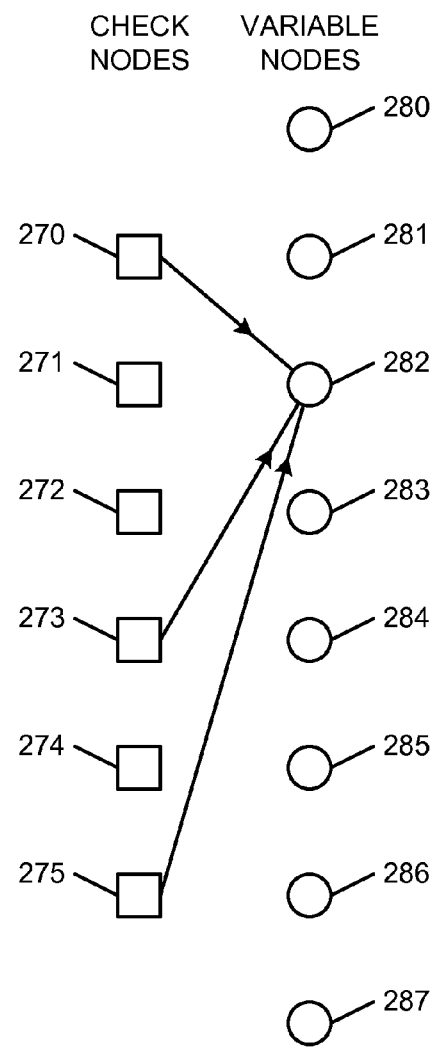
FIG. 2A                                   FIG. 2B

SYSTEMS AND METHODS FOR CONFIGURING PRODUCT CODES FOR ERROR CORRECTION IN A HARD DISK DRIVE

CROSS REFERENCE TO RELATED APPLICATION

This disclosure claims the benefit under 35 U.S.C. §119(e) of U.S. Provisional Application No. 61/704,897, filed on Sep. 24, 2012, and U.S. Provisional Application No. 61/704,919, filed on Sep. 24, 2012, the contents of which are each incorporated herein by reference in its entirety.

FIELD OF USE

This disclosure related to a system and method for using a product code to encode and decode user data stored on a storage device.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

A traditional recording system stores data to a hard disk drive (HDD) on multiple individual tracks that each have guard bands on either side of the track to help prevent unintentional overwriting of the data. Each track is further divided into randomly accessible sectors, which are protected by sector-level error correction codes.

In shingled magnetic recording (SMR), the track pitch is made arbitrarily small, and guard bands are reduced or removed to increase track density. In particular, in SMR, data are stored on partially overlapping tracks that interfere with one another. Accordingly, in such systems data must be written to the HDD on a track-by-track basis. That is, writing data to only a specific sector of a given track of the HDD requires rewriting a given track or a band of sequentially overlapping tracks in its entirety.

Furthermore, in a HDD, different sectors often experience different noise characteristics or different noise realizations, even if the noise has the same statistical properties. Thus, some portions of a disk may be more prone to errors while other portions are less prone to errors, making it sometimes difficult to accurately read the data that is stored on different portions of the HDD.

SUMMARY

In accordance with an implementation of the disclosure, systems and methods are provided for using a product code to encode data, decode data, or both. A method is described for encoding data to be stored on a storage device using a product code having a first dimension and a second dimension. A portion of user data to be written in the first dimension is received, and first parity symbols for the portion of user data are computed, wherein the first parity symbols are with respect to the first dimension. Partial parity symbols are computed for the portion of user data, wherein the partial parity symbols are with respect to the second dimension and are used to obtain second parity symbols for the portion of user data, and the user data, the first parity symbols, and the second parity symbols are stored in the storage device.

Additional portions of user data to be written in the first dimension are received, and, for each additional portion, at least some of the partial second parity symbols using the second dimension of the product code are iteratively updated. In some implementations, the first dimension is a row dimension, the second dimension is a column dimension, and the portion of user data is a row of user data. In some implementations, additional first parity symbols in the first dimension are computed for obtaining the second parity symbols. In some implementations, the product code in the first dimension is an LDPC code, the product code in the second dimension is an LDPC code, and the same encoding circuitry is used to compute the first parity symbols and the partial parity symbols.

In accordance with an implementation of the disclosure, a decoding method decodes data stored on a storage device. Data encoded using a product code having a first dimension and a second dimension is retrieved, and a first codeword in the first dimension is decoded. When the decoding the first codeword in the first dimension is successful, a target syndrome of a second codeword in the second dimension is computed based on a result of the decoding of the first codeword, wherein the first codeword partially overlaps with the second codeword.

Computing the target syndrome of the second codeword comprises removing one or more columns of a parity check matrix for the product code in the second dimension. In some implementations, a result of the decoding of the first codeword is a hard decision associated with the decoding. In some implementations, a parity check matrix for the product code in the second dimension has similar degrees for different portions of the parity check matrix. In some implementations, a coding circuitry performs the decoding of the first codeword and computes the target syndrome of the second codeword in the second dimension.

In accordance with an implementation of the disclosure, an encoder is used for encoding data using a product code having a first dimension and a second dimension. The encoder comprises circuitry configured to receive a portion of user data to be written in the first dimension and compute first parity symbols for the portion of user data, wherein the first parity symbols are with respect to the first dimension. The circuitry is further configured to compute partial parity symbols for the portion of user data, wherein the partial parity symbols are with respect to the second dimension and are used to obtain second parity symbols for the portion of user data, and store the user data, the first parity symbols, and the second parity symbols in a storage device.

In accordance with an implementation of the disclosure, a decoder is used for decoding data stored on a storage device. The decoder comprises circuitry configured to retrieve data encoded using a product code having a first dimension and a second dimension and decode a first codeword in the first dimension. When the circuitry successfully decodes the first codeword in the first dimension, the circuitry is further configured to compute a target syndrome of a second codeword in the second dimension based on a result of the decoding of the first codeword, wherein the first codeword partially overlaps with the second codeword.

BRIEF DESCRIPTION OF THE DRAWINGS

The above and other features of the present disclosure, including its nature and its various advantages, will be more apparent upon consideration of the following detailed description, taken in conjunction with the accompanying drawings in which:

FIGS. 2A, 2B, and 2C are graphical illustrations of communications between variable nodes and check nodes for decoding a codeword, in accordance with an embodiment of the present disclosure;

DETAILED DESCRIPTION

This disclosure generally relates to product codes. To provide an overall understanding of the disclosure, certain illustrative embodiments will now be described, including a product code for encoding and decoding data on a non-volatile storage device. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

Figure 1:
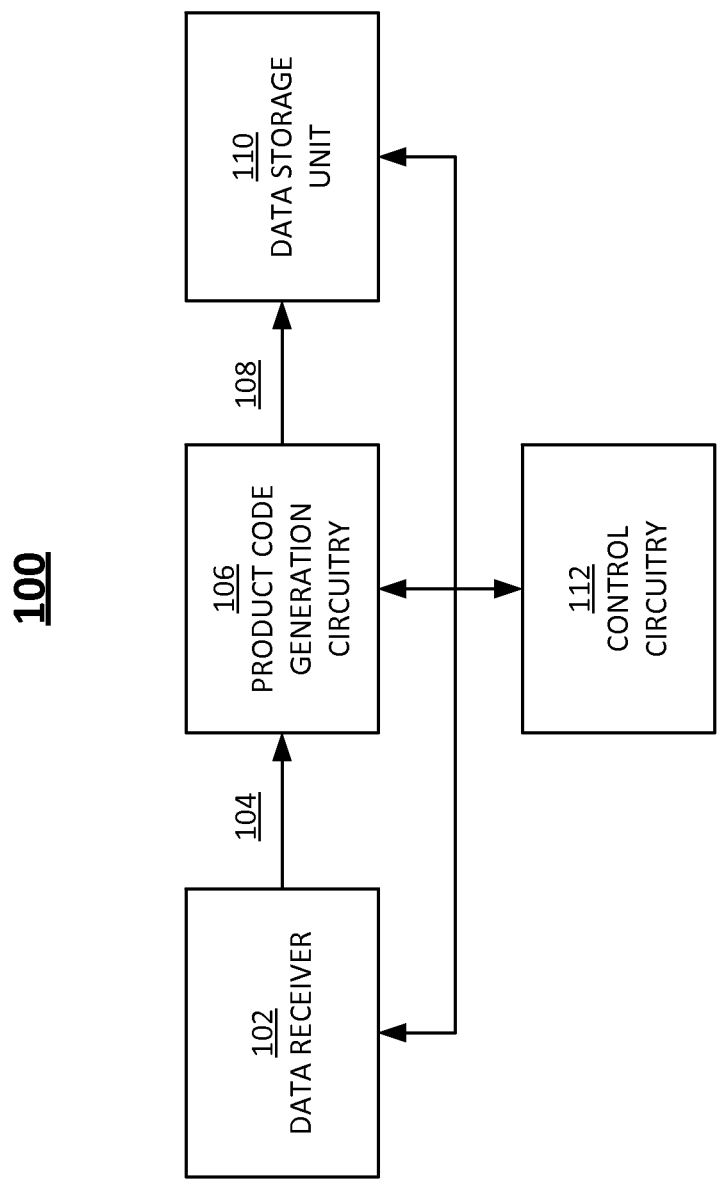
FIG. 1 is a diagram of an illustrative data storage unit, in accordance with an embodiment of the present disclosure.

FIG. 1 is a block diagram of an illustrative product codes system 100. System 100 includes a data receiver 102, product code generation circuitry 106, data storage unit 110, and control circuitry 112. Although the components of system 100 are drawn separately, the components may be implemented as separate devices on different integrated circuits (IC), as separate devices on the same IC, or any combination thereof. In addition, the components of system 100 may be housed together and used by an internal device or an external device.

In an example, system 100 is a system for storing data to a HDD that uses magnetic recording. The disk is also divided into sectors, which include data stored on a magnetic disk in wedges. Furthermore, data on the magnetic disk are arranged into concentric circular tracks on the disk. In shingled magnetic recording (SMR), data is stored in overlapping tracks that interfere with one another. Systems and methods for reading and writing data to non-volatile storage device 150 in a shingled manner are discussed in more detail in: Gregory Burd U.S. patent application Ser. No. 13/082,018, filed Apr. 7, 2011; Burd et al. U.S. patent application Ser. No. 13/050, 315, filed Mar. 17, 2011; Gregory Burd et al. U.S. patent application Ser. No. 13/372,759, filed Feb. 14, 2012; and Burd et al. U.S. patent application Ser. No. 13/413,049, filed Mar. 6, 2012, each of which is hereby incorporated by reference herein in its entirety.

When data are written on a track-by-track basis, track-level coding can be used in addition to sector-level coding to further provide error correction capabilities, especially when noise characteristics vary from sector to sector. In a HDD, different sectors or codewords of the disk may experience different noise characteristics. This causes certain sectors or codewords to be more prone to errors than other sectors or codewords. To enhance data reliability, an additional level of protection may be implemented in a product code. In particular, product code generation circuitry 106 may implement track level coding to improve the error correction of codewords that are more prone to errors. As used herein, the phrase "track level" coding means performing an encoding or decoding operation (encoding or decoding data) across multiple sectors of a given track to generate parity information for a combination of sectors of a given track. Track level encoding systems and methods are described in Varnica et al. U.S. patent application Ser. No. 14/031,277, filed Sep. 19, 2013, which is hereby incorporated by reference herein in its entirety.

Data receiver 102 may be any suitable device or circuitry that is used to receive user data to be encoded with a product code and stored on data storage unit 110. In some implementations, data receiver 102 is a receiver that is coupled or connected to an antenna and may demodulate, decode, and output a signal 104. In some implementations, data receiver 102 is a storage device (such as a HDD or any other suitable non-volatile storage device). Control circuitry 112 may instruct the storage device to read a section of data and to provide the data as signal 104 to product code generation circuitry 106. In some implementations, data receiver 102 includes a software application that outputs signal 104 for subsequent storage on data storage unit 110.

Signal 104 is provided to product code generation circuitry 106, which encodes the data in signal 104 using a product code including a row code and a column code. As is described herein for illustrative purposes only, the row code is the code operating in the direction of the user data as the data is sequentially read or written, while the column code operates on the interleaved user data. However, one of ordinary skill in the art will understand that the systems and methods described herein may also apply to a column code that operates in the direction of the user data as it is being sequentially read or written, and the row code operates on the interleaved user data, without departing from the scope of the present disclosure.

The row code and the column code are error correction codes, and may correspond to the same or different codes. In an example, both the row code and the column code are low density parity check (LDPC) codes that use parity data to encode or decode the user data. When both row and column codes are LDPC codes, the same hardware may be used to implement both sets of codes to reduce cost and save storage. LDPC codes are described in more detail in relation to FIG. 2. In some implementations, the column code may be a code that is different from the row code. After generating the product code, control circuitry 112 may instruct product code generation circuitry 106 to transmit a signal 108 to data storage unit 110 for storage. Signal 108 includes information related to the user data as well as any parity data that was generated by product code generation circuitry 106. For example, signal 108 may include data in a matrix form as shown and described in detail in relation to FIG. 3.

FIGS. 2A and 2B are graphical illustrations of communications between variable nodes 270-275 representing an example codeword (such as a row codeword or a column codeword shown and described in relation to FIG. 1) and check nodes 280-287 for decoding the codeword. The codeword may be a codeword in a row code or in a column code as described above. FIGS. 2A and 2B each show a Tanner graph, which is a bipartite graph that illustrates the parity check constraints for a block code such as an LDPC code. One advantage of using a Tanner graph representation is the use of efficient graph-based message-passing algorithms for decoding.

There are two types of nodes shown in the Tanner graphs. Variable nodes 280-287 are denoted by circles and represent symbols (i.e., bits for a binary code) in a codeword. For example, variable node 280 may correspond to the data symbol 305 shown in FIG. 3, and the set of variable nodes 280-287 may correspond to the row codeword or a column codeword shown in FIG. 3. Check nodes 270-275 are denoted by squares and represent syndromes or parity check equations that successfully decoded codewords must satisfy.

In general, LDPC decoding can be described using a mathematical vector model $Hc=\vec{0}$, in which c is a binary string of length n and H is a parity check matrix H, which is a low-density, sparse n×m matrix, wherein, as above, n is the number of symbols in the codeword, m is the number of check nodes satisfying m≥n−k, and k is the number of symbols in the message. The model is satisfied only when the binary string c is the codeword $\underline{c}$. The parity check matrix H is not necessarily unique, and may be chosen by product code generation circuitry 106 to be computationally convenient and/or to decrease the number of errors generated by the decoding technique of the decoder.

First, a detector is used to assign input states or values to the variable nodes 280-287. Then, a check of the variable nodes is performed by a decoder on a plurality of groups of variable nodes. The decoder uses processing rules to determine a condition of a group of variable nodes. An indication of the determined condition is stored in syndrome memory at a check node, such as check nodes 270-275. The parity check matrix H identifies which check nodes store indications of the determined conditions for which variable nodes. For example, for the nodes pictured in FIGS. 2A and 2B, the parity check matrix H may be as follows:

$$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row of the parity check matrix H corresponds to one of the check nodes, and each column corresponds to one of the variable nodes. In a binary code, the elements of the parity check matrix are 0 or 1, but for a non-binary LDPC code, the elements of the parity check matrix are non-binary. Each row of the parity check matrix forms the coefficients of a parity check equation.

The decoder references the parity check matrix H to identify which variable nodes should be checked by a particular check node. For example, for the check node 273, the decoder determines that check node 273 stores the result of a check of variable nodes 281, 282, 285, and 287 (i.e., the second, third, sixth, and eighth variable nodes). Then, the decoder retrieves the values stored in these variable nodes. The values in the fourth row of the above parity check matrix H are the coefficients of a parity check equation, which are each multiplied by the corresponding values of the variable nodes. For illustration, the arrows in FIG. 2A indicate that the retrieved values flow from the variable nodes 281, 282, 285, and 287 to the check node 273, and the check node 273 may be considered to "check" the variable nodes 281, 282, 285, and 287. In reality, the variable node values are retrieved by the decoder, which processes the values on behalf of the check node 273 according to the processing rules.

From the values received from the variable nodes 281, 282, 285, and 287, the decoder determines whether a given condition for the check node 273 is satisfied or is unsatisfied. An indication of whether the check node 273 is satisfied or unsatisfied (i.e., the "syndrome value" of the check node) is stored in syndrome memory, which stores syndrome values or indications of the check nodes.

After the indications or syndrome values for the check nodes 270-275 have been stored in the syndrome memory, the values of the variable nodes 280-287 may be updated based on the values of the check nodes. The parity check matrix H is again used by the decoder to determine which check nodes should be accessed for a particular variable node. As illustrated in FIG. 2B, for updating the variable node 282, the parity check matrix H given above indicates that check nodes 270, 273, and 275 (i.e., the first, fourth, and sixth variable nodes) should be referenced. Based on the indications of the referenced check nodes, the state of the variable node 282 may be updated.

Figure 2C:
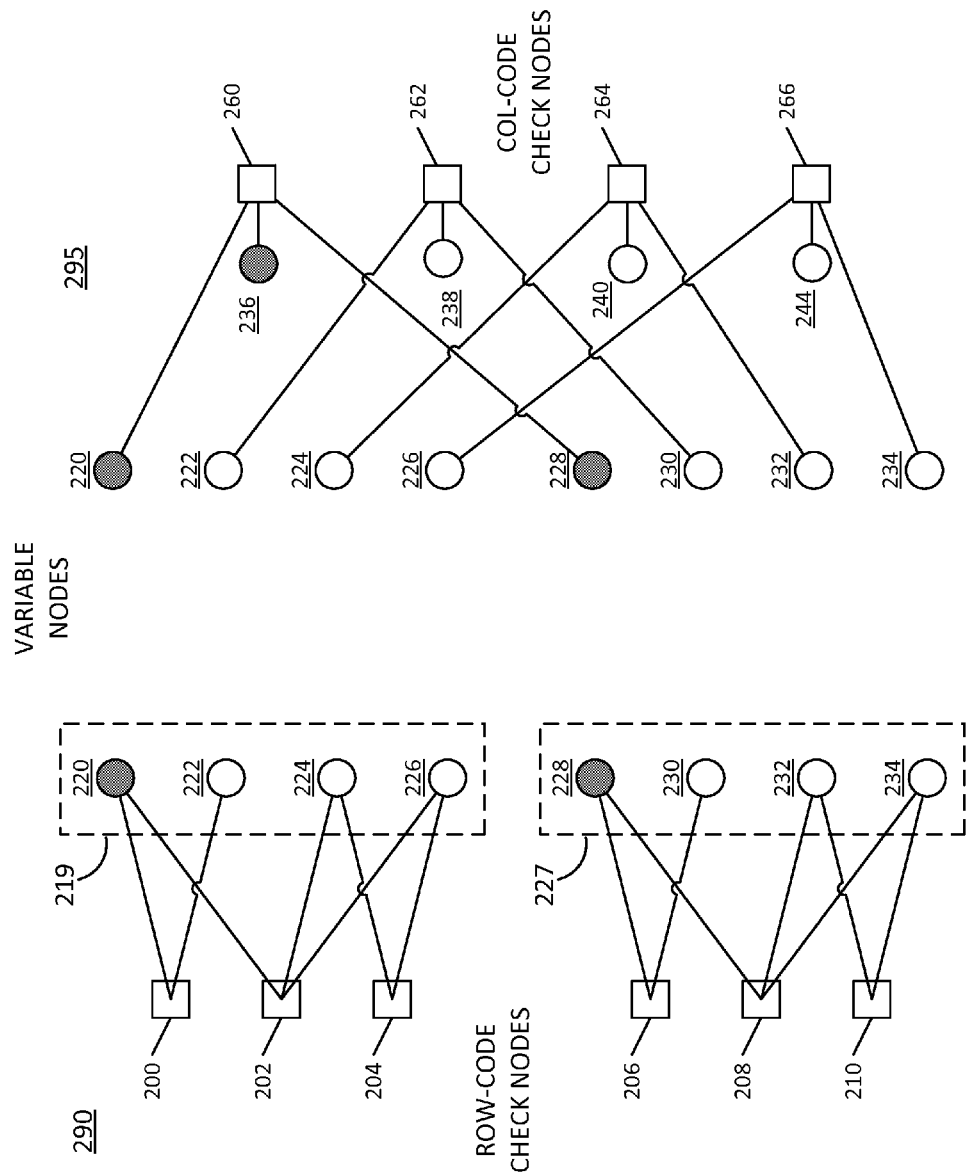

In some embodiments, row and column code decoders for the product code update bit-wise soft information until the user data has been decoded successfully. As an example, FIG. 2C shows Tanner graphs 290 and 295 of the row and column codes of a product code, in accordance with one embodiment. Each of the variable nodes 220-234, denoted by circles, represents a symbol (i.e., a bit for a binary code) in the row codewords 219 and 227. For example, variable node 220 may correspond to the data symbol 305 shown in FIG. 3, while the exemplary codewords 219 and 227 may correspond to row codeword 0 and row codeword 1, respectively. Check nodes 200-204 and 206-210 are denoted by squares and represent syndromes or parity check equations that successfully decoded row codewords must satisfy. Similarly, in Tanner graph 295, variable nodes 220-244 represent four exemplary column codewords, each communicating with a set of check nodes for decoding the column code. For example, the shaded variable nodes 220, 228 and 236 may correspond to the column codeword 0 shown in FIG. 1. In another example, the variable nodes 222, 230, and 238 may correspond to column codeword 1, the variable nodes 224, 232, and 240 may correspond to column codeword 2, and the variable nodes 226, 234, and 244 may correspond to column codeword 3 (not shown in FIG. 1).

The Tanner graphs 290 and 295 may both be used for typical iterative decoding of the row code and the column code, where local iterative message passing steps may be carried out between the variable and check nodes shown in 290 for the row code, and between the variable and check nodes shown in 295 for the column code. Each message-passing iteration involves a symbol-to-check step, and a check-to-symbol step for updating the LLR value associated with each symbol as an a posteriori probability, given the LLR value associated with other symbols related to the symbol under consideration through check nodes. A result of the check-to-symbol step is a set of extrinsic soft information.

In addition, since the variable nodes 220-234 correspond to data and row code parity symbols that are further encoded by the column code to generate column parity symbols represented by variable nodes 236-244, global iterative message passing steps may be carried out between the row code and the column code. For example, the row code decoder may consider the soft information or the LLR values for a set of symbols (e.g., represented by variable nodes for symbols in a row codeword) related by row parity (e.g., represented by row code check nodes), and generate updates or extrinsic information that can be used by a column code decoder to further refine the soft information associated with the symbols in column codewords.

In addition, joint decoding iterations may be performed over any two or all of row-decoding, column-decoding, and channel detection in any order so that soft extrinsic information from one block can be provided to another to improve the decoding process. For example, in iterative decoding between the row code and the column code, extrinsic information for each variable node may be stored and passed from a row-decoder unit to a column-decoder unit and vice versa. With joint decoding, even if the decoding process fails in one dimension, output information can still be used by a decoder in another dimension, or by a channel detector. When extrinsic information corresponding to partial codewords is passed from one decoder to another, decoding performance may be improved while the amount of required storage is reduced. Joint decoding of sector-level and track-level error correction codes is described in Varnica et al. U.S. patent application Ser. No. 14/031,527, filed Sep. 19, 2013, which is hereby incorporated by reference herein in its entirety.

Figure 3:
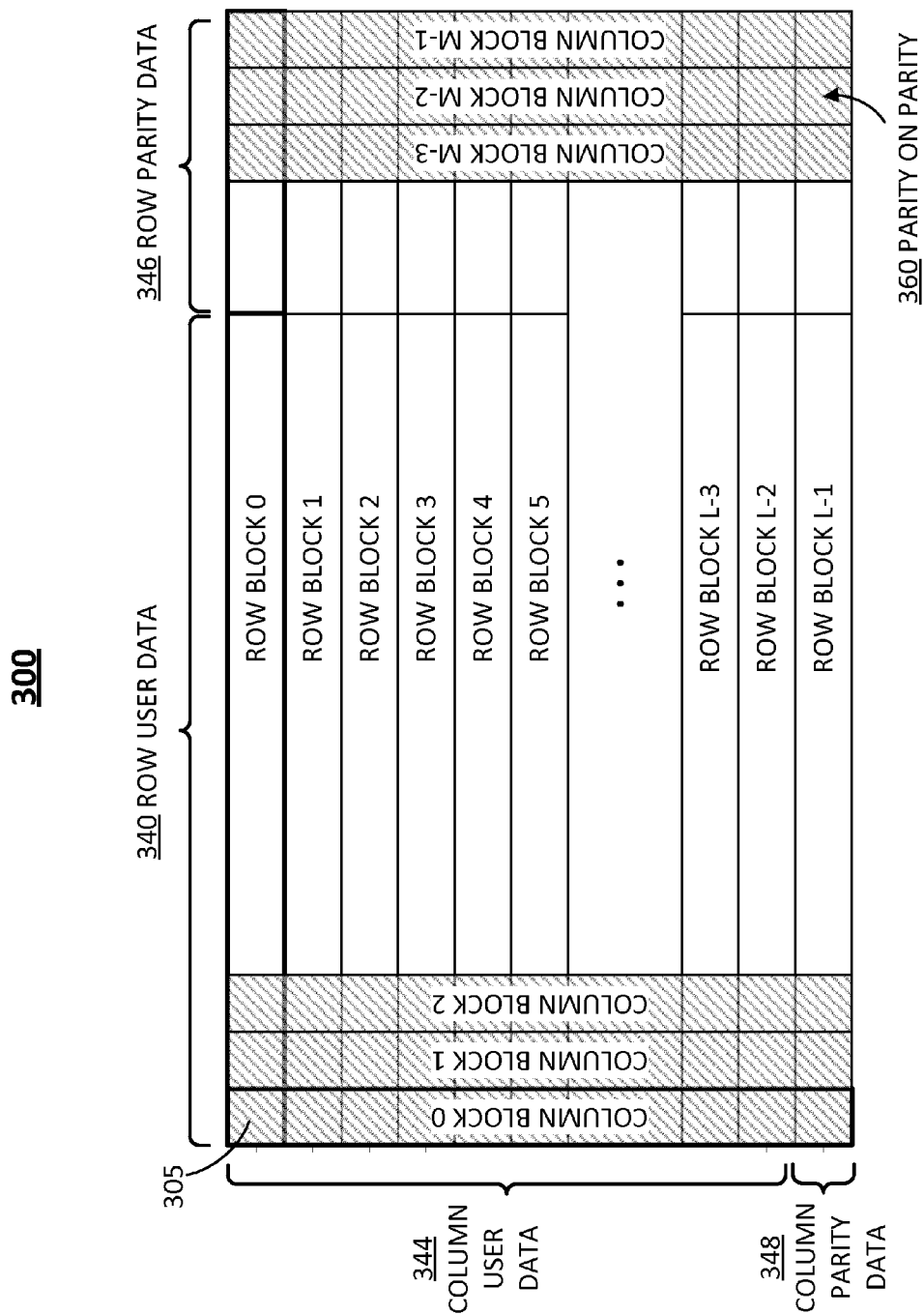
FIG. 3 is a diagram of an illustrative data storage unit 300, in accordance with an embodiment of the present disclosure.
Figure 4:
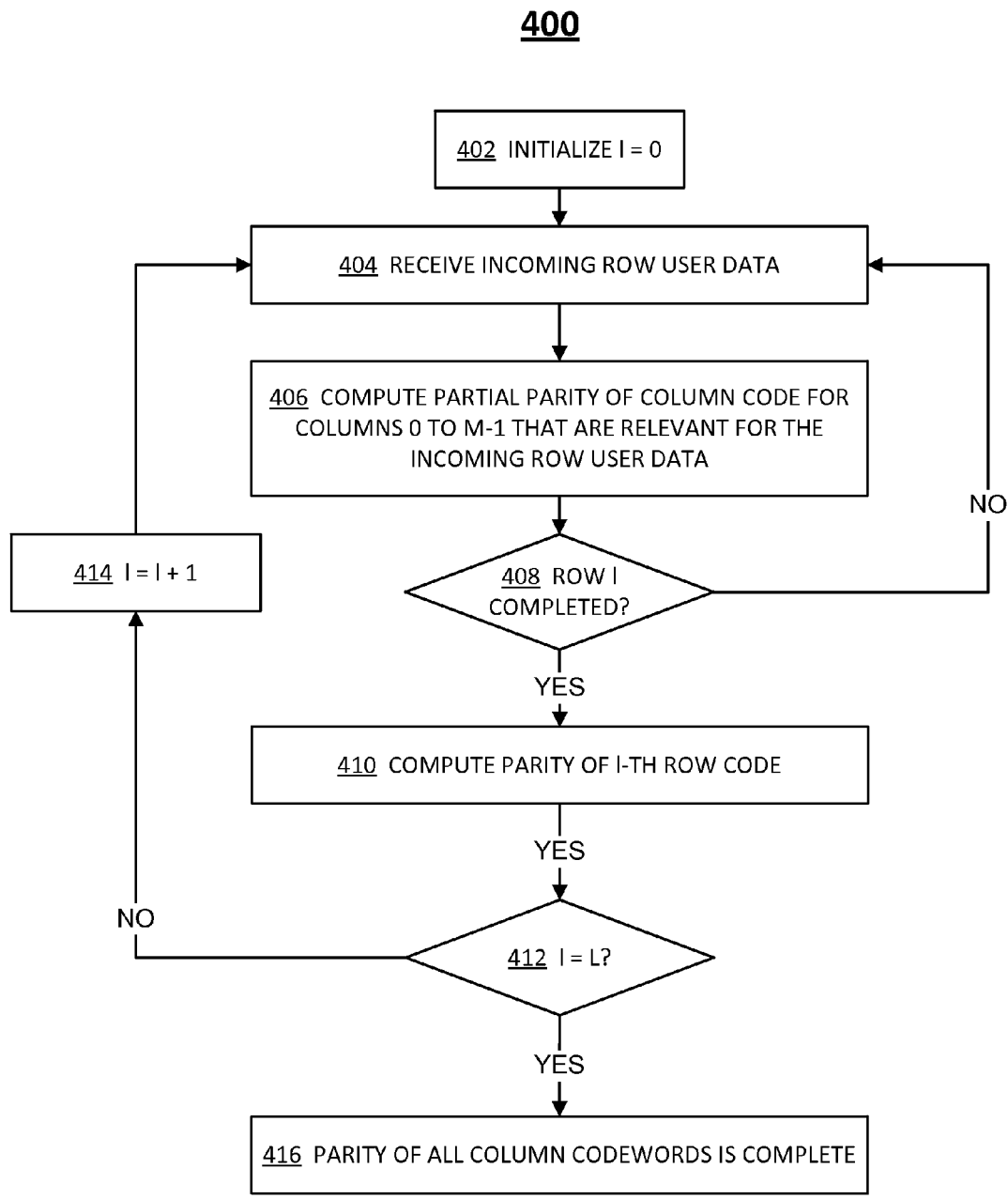
FIG. 4 is a flow diagram of a process for encoding user data using a product code, in accordance with an embodiment of the present disclosure.
Figure 5:
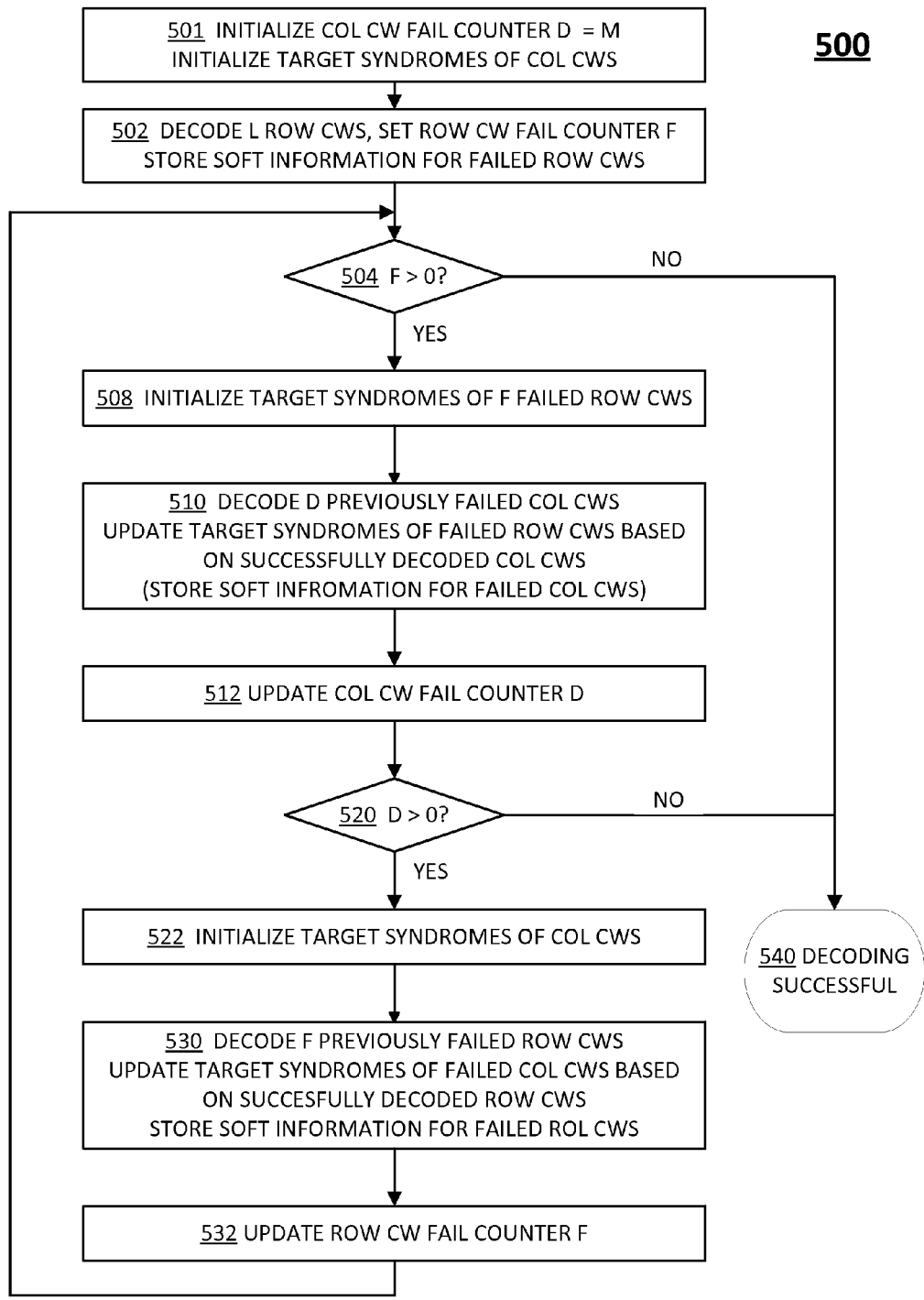
FIG. 5 is a flow diagram of a process for decoding user data that includes pruning a column code and a row code, in accordance with an embodiment of the present disclosure.
Figure 6:
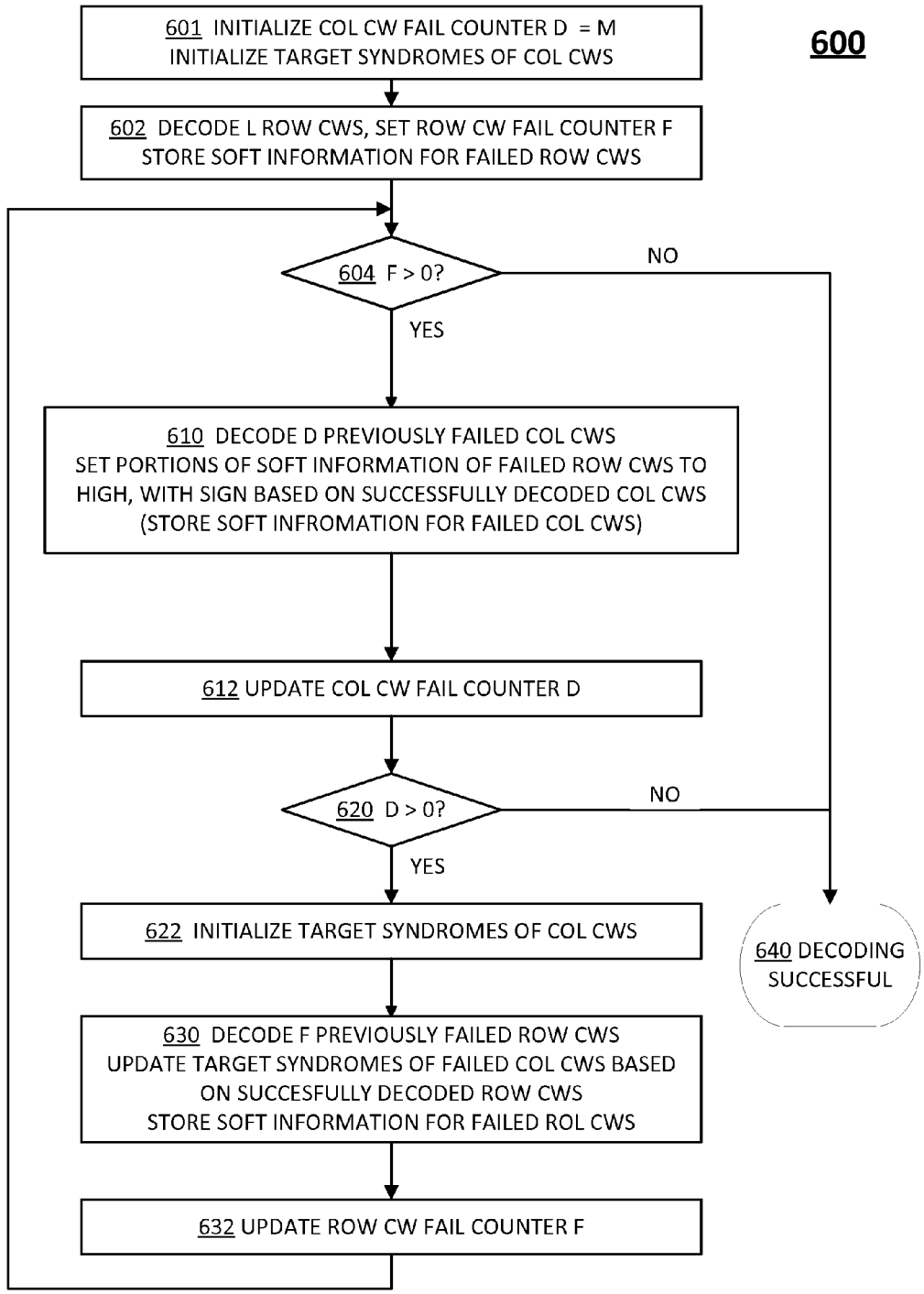
FIG. 6 is a flow diagram of a process for decoding user data that includes pruning a column code, in accordance with an embodiment of the present disclosure.
Figure 7:
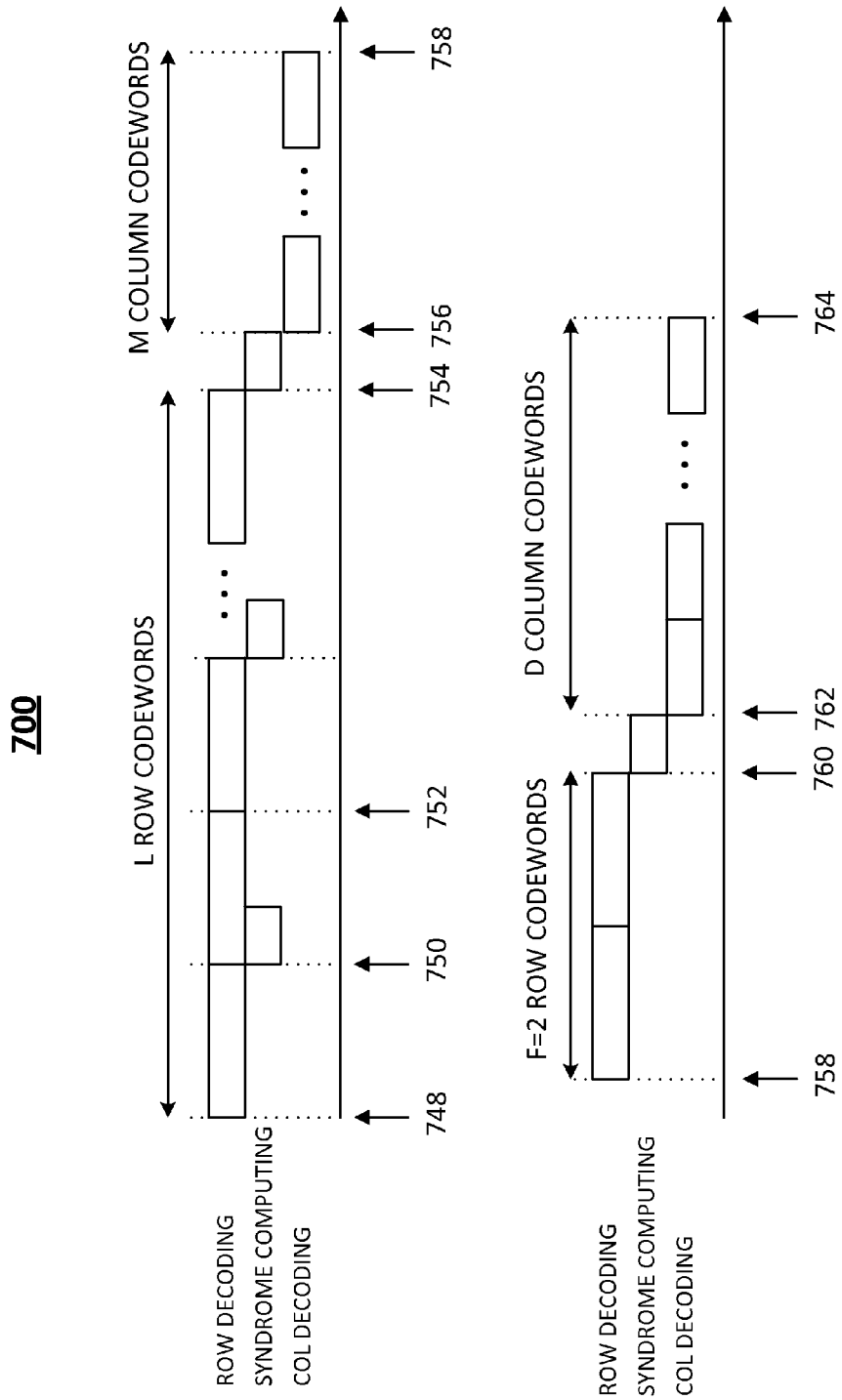
FIG. 7 is a graphical illustration of a timing diagram for decoding user data using a product code, in accordance with an embodiment of the present disclosure.
Figure 8:
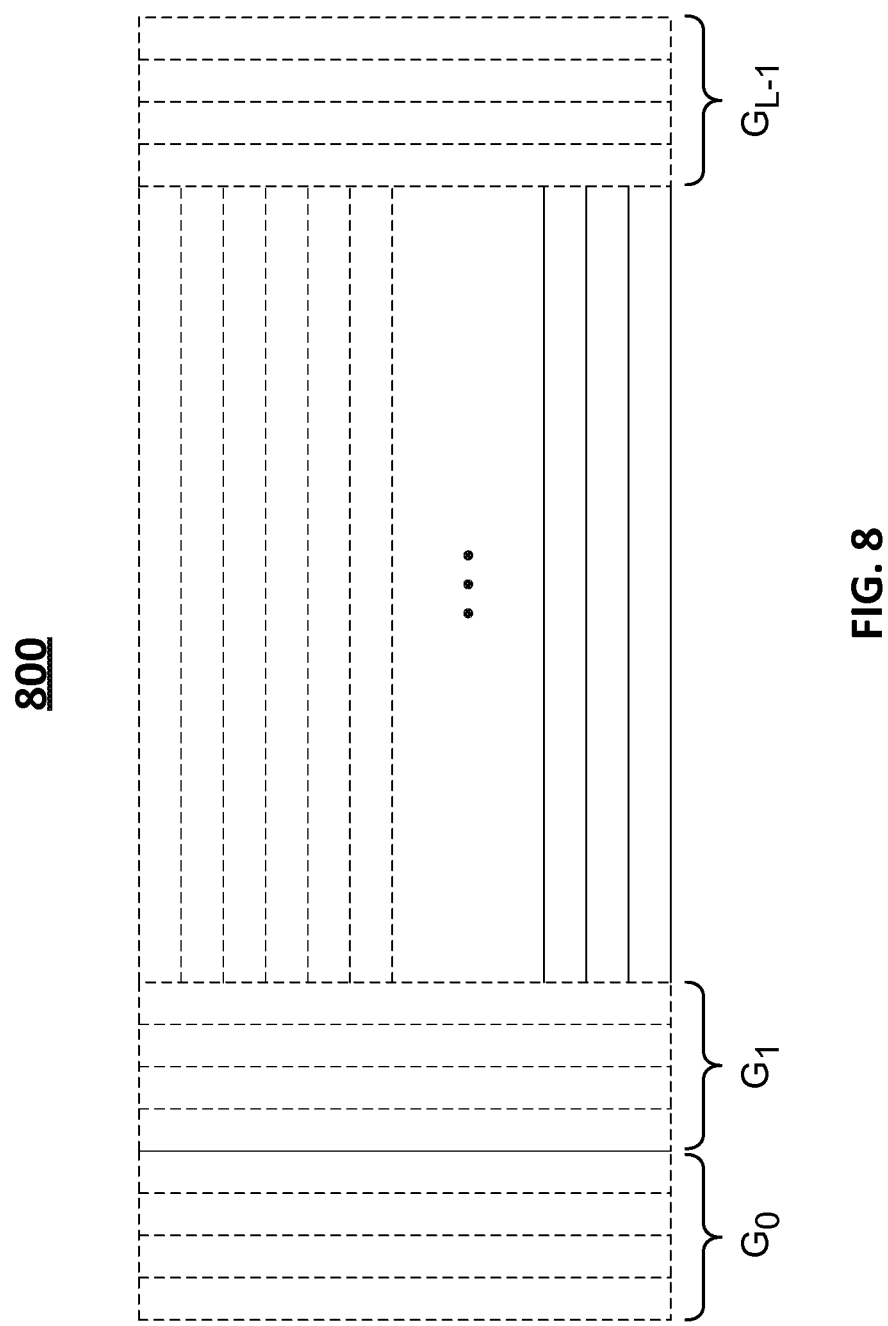
FIG. 8 is a graphical illustration of a parity check matrix that has a reduced size during the decoding process of a set of user data using a product code, in accordance with an embodiment of the present disclosure.
Figure 9:
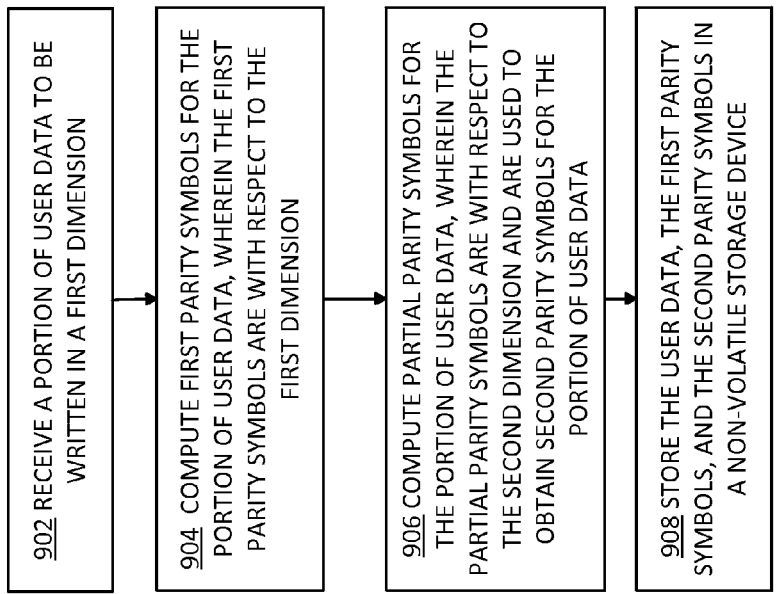
FIG. 9 is a high level flow diagram of a process for encoding data to be stored on a non-volatile storage device using a product code having a first dimension and a second dimension, in accordance with an embodiment of the present disclosure.
Figure 10:
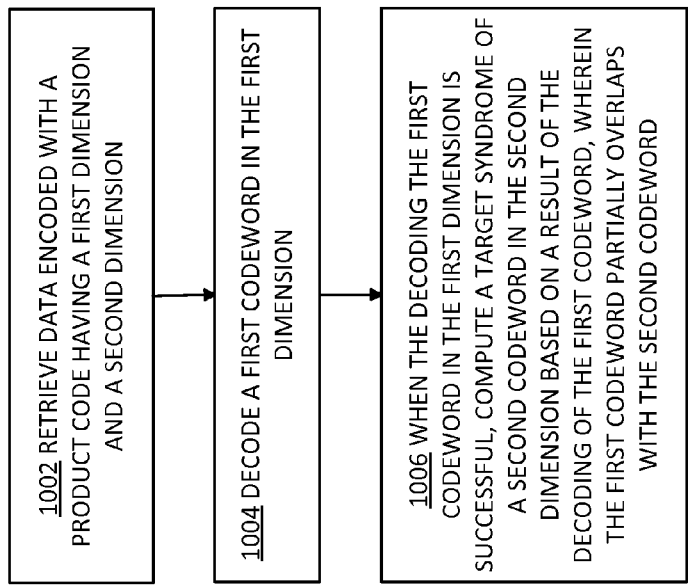
FIG. 10 is a high level flow diagram of a process for decoding data that was encoded using a product code having a first dimension and a second dimension, in accordance with an embodiment of the present disclosure.

As described herein, the product code generated by product code generation circuitry 106 include a row code and a column code that may both be LDPC codes. The diagrams and processes described below are illustrative examples of how product code generation circuitry 106 may encode user data using LDPC codes. In particular, FIG. 3 is a diagram of an illustrative data storage unit that may correspond to data storage unit 110 for storing the user data and the parity data for the row and column codes. FIGS. 4 and 9 are flow charts of processes for encoding user data using row and column parity data, and FIGS. 5, 6, and 10 are flow charts of processes for decoding the user data that has been encoded with the product code. FIG. 7 is a graphical illustration of a timing diagram for the decoding, and FIG. 8 is a graphical illustration of a parity check matrix that may be reduced in size during the decoding process.

FIG. 3 is a diagram of an illustrative data storage unit 300 that stores a product code. Data storage unit 110 of FIG. 1 may be implemented as a storage unit similar to data storage unit 300. As shown in FIG. 3, data is stored in two dimensions—a row dimension and a column dimension. In particular, each bit or symbol in the user data is subject to two separate codes that intersect with each other—a row code and a column code. As shown in FIG. 3, data storage unit 300 includes row user data 340 stored in L rows, row parity data 346, column user data 344 stored in M columns, and column parity data 348. The row parity data 346 is parity data for the L rows of row user data 340, and the column parity data 348 is parity data for the M columns of column user data 344.

Parity-on-parity data 360 may optionally be computed, where parity data from the row code are further encoded by the column code, or vice versa.

As discussed above, the product code shown in FIG. 3 may be applied to data written to an HDD. User data to be written to the HDD may be first received and buffered, before being passed to product code generation circuitry 106, which processes the user data to generate encoded data and writes the encoded data into the HDD.

In the illustrative example shown in FIG. 3, the product code is two dimensional, and includes a row code and a column code. By representing the data in this manner, the encoded data that is stored on data storage unit 110 is encoded twice—once with a code on the sector-level (the row code) and once with a code on the track-level (the column code). In general, one of ordinary skill in the art will understand that the row code can correspond to the track-level code and the column code can correspond to the sector-level code without departing from the scope of the present disclosure.

As is described herein for illustrative purposes only, the row code is the code operating in the direction of the user data as the data is sequentially read or written, while the column code operates on the interleaved user data. However, one of ordinary skill in the art will understand that the systems and methods described herein may also apply to a column code that operates in the direction of the user data as it is being sequentially read or written, and the row code operates on the interleaved user data, without departing from the scope of the present disclosure.

The row code and the column code in the product code shown in FIG. 3 are error correction codes, and may correspond to the same or different codes. In one example, the row code is a low density parity check (LDPC) code that generates parity data from long strings of user data, while the column code is a Bose-Chaudhuri-Hocquenghem (BCH) or Reed-Solomon (RS) code. In another example, both the row code and the column code are LDPC codes, with the same or different rates and generator matrices. When both row and column codes are LDPC codes, the same hardware may be used to implement the encoding or decoding of both sets of codes, thus reducing power use and storage space. In some embodiments, encoding and decoding circuitries for the row and column codes are programmable to support different code rates that may be selected according to read channel noise characteristics. In addition, in various embodiments, the row code and the column code may be binary or non-binary, where each symbol 305 of a codeword may represent the element of a binary field or a finite field of a given size.

In the example shown in FIG. 3, row encoding is performed before column encoding, where row code is the code operating in the direction of the user data as the data is sequentially read or written, while the column code operates on the interleaved user data. Row parity data 346 are generated from row user data 340, and are concatenated to row user data 340 to form individual row codewords. Similarly, column parity data 348 are generated from column user data 344, and are concatenated to column user data 344 to form individual column codewords.

In an example, the product code corresponds to data written to a track of an HDD, where each row codeword is written into a sector of an HDD, with row parity data 346 being sector-level parities. In this case, L, the number of row blocks of row user data 340, corresponds to a number of sectors on a track. Thus, for L row blocks (labeled row blocks 0 to L-2 and row block L-1), a total of L sectors are written onto a track or a partial track. In one embodiment, the last sector of the track (or the partial track) is of same size or similar size as the first L-1 sectors. In this case, the column code parity data 348 are encoded as parity-on-parity data 360 so that both track-level parities may be written onto the track after the first L-1 row codewords.

In the example shown in FIG. 3, the size of column parity data 348 is equal to one row block of row user data 340. In this case, the first L-1 row blocks 0 to L-2 of row user data 340 are valid row codewords. The last row block L-1 corresponds to the column parity data 348. When the column parity data 348 is encoded with the row code (to generate parity-on-parity data 360), then the column parity data 348 is also a valid row codeword. However, if parity-on-parity data 360 is not generated, then the column parity data 348 (and the last row block L-1) is not necessarily a valid codeword of the row code. As shown in FIG. 3, the column parity data 348 is the same size as one row block of row user data 340. In general, if parity-on-parity data 360 is generated, then column parity data 348 may have a size that is any integer multiple of the size of a row block of row user data 340. It may be preferable to design the size of the column parity data 348 to be an integer multiple of the size of a row codeword for ease of implementation.

In some embodiments, the parity-on-parity data 360 is not generated based on column parity data 348. In this case, the size of column parity data 348 is not restricted to be an integer multiple of a size of a row block, and the last row block L-1 is not a valid row codeword. In these examples, sector-level error correction coding may be applied before track-level error correction coding. Typical sector sizes are 512 bytes or 4 KB but in general may be any suitable size.

When row parity data 346 and column parity data 348 are independently generated from user data, product code generation circuitry 106 may include a column encoder and a row encoder implemented in hardware that run simultaneously in parallel to generate the product code. Alternatively, row parity data 346 and column parity data 348 may be generated partially and progressively as incoming data arrives, where parity symbols may be generated and buffered.

In some embodiments, the column code is generated before the row code, where column parity data 348 is encoded with the row code to generate the parity-on-parity data 360. In other words, track-level encoding may be applied before sector-level error-correction coding. In some embodiments, a run-length modulation code may be further applied before the track-level code or after the sector-level code. Depending on the rate of the row code and the rate of the column code, the total amount of column parity data 348 for may not necessarily be an integer multiple of the size of one row codeword. In addition, if the column code has a much shorter codeword length than the row code does, and if each column codeword is written into a sector, the number of row codewords in the product code may be substantially smaller than the number of column codewords. For example, L may be 16, 32, or 64, while the total number of column codewords M may be 300. If the column code has a much longer codeword length than the row code does, and if each row codeword is written into a sector, the number of column codewords in the product code may be substantially smaller than the number of row codewords. For example, M may be 16, 32, or 64, while the total number of row codewords L may be 300.

To read track-level product-code protected data previously written to a non-volatile storage device such as an HDD, a control circuitry may configure a read-head to obtain a readback signal, where sectors including user data and sector-level parities are sequentially read before track-level parities are read. Such a front end analog read-back signal may be processed by analog and digital read-channel processing circuitries to obtain digitized bit samples and soft information indicative of the reliability of each detected bit. For example, with binary codes, soft information may be represented as a Log Likelihood Ratio (LLR), which is the natural logarithm of the ratio of the probability that a bit is a 1 to the probability that the bit is a 0. Thus, the sign of the LLR values may represent the best estimate of the detected binary sequence, and can be considered hard decisions for the detected sequence. For example, the corresponding hard decision for a positive LLR value may be 1, while the corresponding hard decision for a negative LLR value may be 0.

As shown in FIG. 3, the column parity data 348 is protected by encoding the column parity data 348 using a portion of row parity data 346 (corresponding to the row L-1) to form the parity-on-parity 360. However, in general, the column parity data 348 may or may not be protected. If protected, the column parity data 348 may be encoded using any number of rows, as the encoding is not limited to a single row as depicted in FIG. 3. In some embodiments, the column parity data 348 is unprotected, meaning that no data is stored in the parity-on-parity 360 portion of the product code. In another embodiment, the size of column parity data may not match the size of one row codeword or may not match the size of an integer number of row codewords. In such embodiments, the last block will be with smaller/larger size than one row codeword. This requires that the system handles last block of data in a special/separate manner.

In some embodiments, the user data is encoded using the row code first, then the user data is encoded by the column code. In this case, row parity data 346 is computed before computing the column parity data 348. In other embodiments, the column parity data 348 is computed before computing the row parity data 346. However, computing the row parity data 346 before the column parity data 348 (and vice versa) may be inefficient. Instead, the row parity data 346 and the column parity data 348 may be computed in parallel or simultaneously to increase efficiency and save on computational cost. An example of a technique for simultaneously computing the row parity data 346 and the column parity data 348 is described in detail in relation to FIG. 4.

FIG. 4 is a flow diagram of a process 400 for encoding user data using a product code. Process 400 may be implemented by product code generation circuitry 106 shown in FIG. 1 to encode user data for storage in data storage unit 110. Rather than computing all the row parity data 346 before computing all the column parity data 348 (or vice versa), process 400 is an example of a technique for performing the row and column encoding operations simultaneously. In particular, as incoming user data is received and saved into rows of a matrix such as the matrix shown in FIG. 3, partial column parity data may be updated that corresponds to the current parity values for the received data. As the user data is received, even though the user data in a column is incomplete, the partial column parity values are computed on the incomplete user data. In this way, when a complete row of user data is received, the row parity data for the row is complete, and M partial column parity values are updated. While process 400 is described herein for the user data being saved into rows, one of ordinary skill in the art will understand that the user data may also be saved into columns, such that partial row parity data is updated as columns of the user data are received. In this way, the row encoding and the column encoding may involve performing computations at a row encoder and a column encoder in parallel as the incoming data is received.

At 402, a row counter l is initialized to zero. The row counter l is a parameter that indicates the current row in a matrix such as the matrix shown in FIG. 3. At 404, incoming row user data is received. In an example, data receiver 102 receives the incoming row user data from control circuitry 112 and transmits the row user data to product code generation circuitry 106.

At 406, product code generation circuitry 106 computes at least one partial column parity that is relevant for the incoming row user data. A partial column parity value corresponds to the parity of the received data, when additional data is expected to be received. In other words, the thus far received data is incomplete, and parity values may be stored in a partial column parity buffer for updating. When a complete set of data is received, the values that are stored in the partial column parity buffer may be stored as the column parity data 348. In particular, when the column code is an LDPC code, the partial column parity values are computed based on a partial parity check matrix of the column LDPC code corresponding to the thus far received data (thus far received columns).

To determine those columns that are relevant for the incoming row user data, product code generation circuitry 106 identifies the corresponding columns, which are to be used to compute partial parity of column code. In an example, the incoming row user data corresponds to a complete l-th row of data. In this case, because a complete row of data is received, parity data for all M columns are updated to include partial column parities. In another example, the incoming row user data corresponds to a portion of the l-th row of data. In this case, only those columns corresponding to the portion are selected for updating the partial column parities.

At 408, product code generation circuitry 106 determines whether the l-th row is complete. In particular, product code generation circuitry 106 determines whether the user data for the entire l-th row has been received. If the l-th row is not complete, process 400 returns to 404 to receive additional incoming row user data. Otherwise, when the l-th row is complete, process 400 proceeds to 410 to compute the parity of the l-th row as the row parity data 346. As is described in relation to FIG. 2, when the row code is an LDPC code, the row parity data is computed based on the parity check matrix of the row LDPC code.

At 412, the row counter l is compared to L, which is the total number of rows. If l is less than L, process 400 proceeds to 414 to increment the row counter l and returns to 404 to receive additional incoming row user data for the next row. When the row counter l reaches the total number of rows L, process 400 proceeds to 416 to determine that the parity of all the column data is complete. In particular, at 416, the current values in the partial column parity data are saved as the column parity data 348.

FIG. 5 is a flow diagram of a process 500 for iteratively decoding user data using a product code, where a column code and a row code are pruned during the decoding process. Process 500 may be implemented by a decoder to decode user data that was previously encoded using a product code and stored in data storage unit 110. Rather than decoding all the row data before decoding all the column data (or vice versa), process 500 is an example of a technique for performing the row and column decoding operations simultaneously.

Even though not all of the L row blocks and M column blocks shown in FIG. 3 are necessarily valid codewords, when the decoding processes are described herein, the terms "row block" and "row codeword" are interchangeable, and the terms "column block" and "column codeword" are interchangeable. In particular, as shown in FIG. 3, because the parity-on-parity data 360 is shown, each of the L row blocks is a valid row codeword. Similarly, each of the M column blocks is a valid column codeword.

In particular, as the encoded user data is received, "target syndromes" of row codewords and "target syndromes" of column codewords may be updated based on whether any of the decoding of the codewords has been successful or has failed. As used herein, a "target syndrome" refers to an expected syndrome when decoding is successful. In particular, the target syndrome is typically a zero vector for standard decoding. However, in accordance with the present disclosure, the target syndrome in one dimension may be updated as successful decoding occurs in another dimension. In an example, a column codeword (such as column block 0) overlaps with a row codeword (such as row block 0) at one or more symbols (such as symbol 305). When row decoding of the row codeword is successful, the values for the one or more overlapping symbols are known, and the decoding of the column codeword may be simplified by removing the portion of the parity check matrix of the column codeword that corresponds to the known overlapping symbols. Removing this portion of the parity check matrix is referred to herein as "pruning" the parity check matrix. Furthermore, the target syndrome is accordingly updated to account for the pruning of the parity check matrix. As used herein, a "target syndrome" may also be referred to as a "partial syndrome" or a "coset syndrome."

When the row code, the column code, or both are implemented as LDPC codes, updating the target syndromes of the codewords may include pruning or removing one or more portions of the parity check matrix H and computing a target syndrome based on the removed portion to improve the efficiency of the decoding process. An effect of the pruning of the parity check matrix H is removal of several of the branches of the LDPC graph, such as the Tanner graphs shown in FIGS. 2A, 2B, and 2C. Process 500 shows a technique where pruning is performed for both row and column codes, while process 600 in FIG. 6 shows a technique where pruning is performed for the column code but not for the row code.

Process 500 is an iterative process for decoding user data encoded with a product code. In this illustrative example, row decoding is performed on all row codewords first. If any row codeword fails (i.e., cannot be decoded), column decoding is performed on all column codewords. The steps of iterating between row decoding of previously failed row codewords and the column decoding of previously failed column codewords are repeated until all row codewords or all column codewords have been decoded successfully.

At 501, a column codeword fail counter D that identifies the number of undecoded or "failed" column codewords is initialized to M, where M is equal to the total number of column codewords in the product code. In addition, storage space is allocated for the storage of target syndromes of column codewords and are set to zero vectors.

At 502, the L row codewords are decoded, where the total number of row codewords that have failed is tallied by the row codeword fail counter F. During row-decoding, soft information such as LLRs may be updated for a given number of row-decoding message-passing iterations. The desirable number of iterations may be programmable and configured in real-time by the row-decoder, based on read channel noise characteristics and/or other relevant system parameters. LLRs computed for each symbol may be compared to a threshold to make symbol-level hard decisions. A row codeword thus determined may be passed through a syndrome decoder to determine whether the computed syndrome (computed as the product of the parity check matrix H and the codeword) matches the target syndrome. If the computed syndrome matches the target syndrome, decoding of the row codeword was successful because a valid codeword was found. However, if the computed syndrome does not match the target syndrome, then the computed syndrome indicates that no valid codeword is found, and the row codeword is said to have failed the row-decoding process. For each failed row codeword, channel detector soft information such as detector LLRs are stored in memory. Optionally, extrinsic information such as the APP LLR computed by the row-decoder may be stored for failed row codewords. In an example, soft information is stored for each symbol within the failed row codewords. Such soft information stored from the row-decoding process may later be passed to the column decoding process to improve the performance of the column decoding process.

At 504, the row codeword fail counter F is examined to determine whether F is greater than zero. In particular, if all row codewords have been decoded successfully, F is zero, and all the user data that was protected by the product code have been recovered. In this case, process 500 proceeds to 540 to indicate that decoding of all the user data is successful. Otherwise, if it is determined at 504 that one or more row codewords have failed (i.e., that F is greater than zero), process 500 proceeds to 508 to allocate storage space and initialize target syndromes corresponding to the F failed row codewords to zero vectors.

At 510, column codewords that have previously failed are decoded. During the first time that 510 is performed, the column codeword fail counter D is equal the total number of column words, which equals M for the example shown in FIG. 3. The column decoder is also initialized with soft information corresponding to failed row codewords. Such soft information may include channel detector LLRs or extrinsic LLRs computed by the row decoder. The column-decoder then performs localized message-passing steps and syndrome calculations to determine user data corresponding to each column codeword.

Depending on whether the column codewords are successfully decoded or not, the target syndromes of failed row codewords may be updated, or the soft information may be stored for the failed column codewords. In particular, when the decoding of a column codeword is successful, the target syndromes of the failed row codewords are updated. In an example, once some symbols are correctly identified from column decoding, the target syndromes for previously failed row codewords are updated. However, for column codewords that have failed at 510, the soft information for the failed column codewords may be stored and later passed to the row-decoder as is described below in relation to 530.

At 512, the column codeword fail counter D is updated to reflect the remaining number of failed column codewords after the decoding at 510. At 520, the column codeword fail counter D is examined to determine whether all column codewords have been decoded successfully. If so (i.e., D is equal to zero), then this means that all user data protected by the product code have been recovered, and the decoding process is declared successful at 540. However, if it is determined at 520 that one or more column codewords have failed (i.e., D is greater than zero), process 500 proceeds to 522 to reserve space and initialize target syndromes corresponding to the D failed column codewords to zero vectors, and the iterations between row decoding and column decoding continue to be performed at the decoder.

At 530, the F row column codewords that have previously failed at 502 are attempted to be decoded again, based on the information that some symbols within each previously failed row codeword may have been successfully decoded through the column decoding process at 510. Alternatively, soft information corresponding to some symbols within the row codeword to be decoded again at 530 may have been updated as the result of 510. For example, if a symbol has been correctly identified through the column decoding of a column codeword and has been used to update the partial parity of an overlapping row codeword (at 510), subsequent row decoding of the overlapping row codeword only needs to decode symbols other than symbol that has already been correctly identified through the successful column decoding. One way to implement this process is to prune a parity check matrix of a row code by removing a portion of the parity check matrix of the row code that corresponds to the successfully decoded column. In another example, if the column decoding of a column codeword fails (at 510), soft information corresponding to one or more symbols in the codeword may still be provided to the row-decoder for decoding one or more row codeword. Furthermore, upon successful decoding of the row codeword, target syndromes for the previously failed column codeword may be updated. On the other hand, if the row codeword is still not correctly decoded at 530, soft information corresponding to the failed row codeword may be stored, for further use in the decoding of column codeword.

At 532, the row codeword fail counter F is updated to reflect the remaining number of failed row codewords after the attempted row decoding at 530. The process 500 then returns to 504, where the row codeword fail counter F is examined to determine whether all previously failed row codewords have been decoded successfully thus decoding can be declared successful. As shown in FIG. 5, the iterations between column decoding (described in relation to 510) and row decoding (described in relation to 530) continue to repeat until all row codewords or all column codewords have been successfully decoded.

FIG. 6 is a flow diagram of a process 600 for iteratively decoding user data encoded with a product code. In process 600, a column code but not a row code is pruned during the decoding process. Process 600 may be implemented by a decoder to decode user data that was previously encoded using a product code and stored in data storage unit 110. Process 600 is similar to process 500 described in relation to FIG. 5, with the exception that process 600 does not include pruning (or syndrome decoding via computation of the target syndromes) of the row code. In particular, as the encoded user data is received, standard decoding of the row codewords may be performed, while target syndromes of the column codewords are updated based on whether any of the standard decoding of the row codewords has been successful or has failed. As described in relation to FIG. 5, updating the target syndromes of the column codewords includes pruning one or more portions of the parity check matrix H to improve the efficiency of the decoding process.

Most of process 600 is equivalent to process 500, with the exception of 610. In particular, 610 of process 600 differs from 510 of process 500 in that when decoding of a column codeword is successful, the target syndromes of the failed row codewords are updated at 610. However, at 610, when the decoding of a column codeword is successful, the portions of soft information of the failed row codewords are set to a high predetermined value, with the sign of the predetermined value based on the successfully decoded column codeword. In particular, the high predetermined value may be a maximum LLR value, and the sign of the LLR value corresponds to the corresponding decoded value. The remainder of 610 is similar to 510 of process 500.

FIG. 7 is a graphical illustration of a timing diagram 700 for decoding user data using a product code. In particular, diagram 700 includes three sets of rectangles along a time axis that indicate the various time intervals during which row decoding (top), syndrome computing (middle), and column decoding (bottom) take place. In particular, timing diagram 700 shows that syndrome computing takes place during the decoding of the row codewords. As described herein, syndrome computing refers to target syndrome computing. As described in detail in relation to FIG. 5, target syndrome computing includes progressively updating the syndrome of column codewords during row decoding, or progressively updating the syndrome of row codewords during column decoding. If the decoding of a row codeword is successful, the hard decisions of the decoding may be used to update current values of the target syndromes of the column codewords. As row decoding is completed, the column syndrome computations are also completed and are used to correct errors in column codewords.

In particular, timing diagram 700 includes four main time intervals. Each main time interval includes the attempted decoding of a set of remaining row codewords or a set of remaining column codewords. In particular, a first main time interval (between times 748 and 754) includes the attempted decoding of L row codewords, and a second main time interval (between times 756 and 758) includes the attempted decoding of M column codewords. During these initial two main time intervals, the decoding of one or more codewords may fail. In this case, a third main time interval (between times 758 and 760) depicts the attempted decoding of F row codewords, where F corresponds to the number of row codewords that failed to successfully be decoded during the first main time interval. In addition, a fourth main time interval (between times 762 and 764) includes the attempted decoding of D column codewords, where D corresponds to the number of column codewords that failed to be successfully decoded during the second main time interval.

During the first main time interval, a decoder attempts to decode all L row codewords. During the decoding of the L row codewords, target syndromes for the M column codewords are computed or updated when the decoding of a row codeword is successful. In an example, the decoding of row codeword 0 takes place in the time interval immediately preceding time 750. When the decoding of row codeword 0 is successful, the target syndromes for all M column codewords are updated starting at time 750. In particular, the hard decisions resulting from the successful decoding of the row codeword 0 is used to update the current values of the target syndromes of the column codewords. However, if the decoding of a row codeword fails, the target syndromes for the column codewords are not updated. For example, the decoding of row codeword 1 takes place in the time interval between times 750 and 752. The row decoding of row codeword 1 fails, such that no updating of the target syndromes is performed at time 752.

At time 754, each of the L row codewords have been attempted to be decoded. When decoding of row codeword L-1 is successful, the target syndromes for all M column codewords are updated at time 754, and the M column codewords are attempted to be decoded during the second main time interval (that starts at time 756 and ends at time 758). After the M column codewords have been attempted to be decoded, the decoding process returns to decode the F (out of L) row codewords that failed to successfully be decoded during the first main time interval. During the decoding of the F row codewords, the LLR values are improved or updated by taking into account the extrinsic information that were computed during the column decoding process. In the example shown in FIG. 7, the decoding of one of the two row codewords (the second row codeword) is successful, and the decoding of the other of the two row codewords (the first row codeword) fails.

Because one of the row codewords failed in the third main time interval, the remaining column codewords (the D column codewords that have not yet been successfully decoded) are re-attempted to be decoded during the fourth main time interval between times 762 and 764. The decoding time per column codeword for the fourth main time interval is likely shorter than the decoding time per column codeword for the first main time interval. This is because many of the row codewords have been successfully decoded, such that the corresponding portions of the parity check matrix (corresponding to the successful row codewords) of the parity check matrix for the column code have been pruned or removed.

FIG. 8 is a graphical illustration of a parity check matrix 800 that may have a reduced size during the decoding process of a set of user data using a product code. As described in relation to FIGS. 5 and 6, the parity check matrix may be pruned depending on whether the decoding of one or more rows is successful. In particular, as the encoded user data is received, target syndromes of row codewords and target syndromes of column codewords may be updated based on whether any of the decoding of the codewords has been successful or has failed. Updating the target syndromes of the codewords may include pruning or removing one or more portions of the parity check matrix H to improve the efficiency of the decoding process.

Parity check matrix 800 is described herein as a parity check matrix for a column code. However, one of ordinary skill in the art will understand that in general, the parity check matrix 800 may be for a row code without departing from the scope of the present disclosure. Parity check matrix 800 includes L portions $G_0, G_1, \ldots, G_{L-1}$, each portion $G_l$ corresponding to the l-th row codewords of FIG. 3. During the decoding process, if the l-th row codeword is successfully decoded, the corresponding portion $G_l$ is pruned or removed from parity check matrix 800. This process is repeated as decoding of each of the L row codewords is attempted, until F portions are left in parity check matrix 800, where F is the number of row codewords that failed to successfully decode.

In some embodiments, it is desirable to design parity check matrix 800 to have certain characteristics. In an example, product code generation circuitry 106 designs parity check matrix 800 such that the degrees of the check nodes (or the number of edges emanating from the check nodes in the Tanner graphs shown in FIGS. 2A, 2B, and 2C) corresponding to each of the portions are uniform, or as uniform as is practically possible. Uniform or approximately uniform degrees of check nodes across the different portions may be advantageous so that the uniformity is preserved as the matrix is pruned. For example, having uniform degrees implies that each portion of the matrix 800 has the same number P of check nodes with degree X, same number Q of check nodes with degree Y, etc, where P, Q, X and Y may be any suitable numbers.

In another example, parity check matrix 800 may be designed to reduce a number of short cycles. In particular, a cycle for an LDPC code corresponds to a set of connected edges in a Tanner graph that starts and ends at the same node. A length of a cycle corresponds to the number of edges in the cycle. Short cycles (i.e., cycles of size-4) may cause degradation of the performance of LDPC decoding, because short cycles may affect the independence of the extrinsic information exchanged during the iterative decoding. It is generally desirable to have long cycles or no cycles. Parity check matrix 800 may be designed by product code generation circuitry 106 to have a limited number of short cycles for each portion. Designing a portion to have a small number of short cycles or no short cycles at all may be easier than designing an entire matrix to have a limited number of short cycles. This may be particularly desirable for short column codes that have high code rates, where cycles of size-4 may not be completely prevented from occurring.

FIG. 9 is a high level flow diagram of a process 900 for encoding data to be stored on a non-volatile storage device using a product code having a first dimension and a second dimension. Process 900 may be implemented by product code generation circuitry 106 to encode a set of user data.

At 902, product code generation circuitry 106 receives a portion of user data to be written in a first dimension. In particular, the first dimension may be a row dimension. At 904, product code generation circuitry computes first parity symbols for the portion of user data that was received at 902. The first parity symbols are with respect to the first dimension. When the first dimension is a row dimension, the received portion of user data may correspond to row user data 340 shown in FIG. 3, and the first parity symbols corresponds to row parity data 346.

At 906, product code generation circuitry computes partial parity symbols for the portion of user data that was received at 902. The partial parity symbols are with respect to the second dimension and are used to obtain second parity symbols for the portion of user data. In particular, the partial parity symbols are with respect to the column dimension. As described in relation to FIG. 4, a partial column parity value corresponds to the parity of the received data, when additional data is expected to be received. In other words, the data that is thus far received is incomplete, and parity values may be stored in a partial column parity buffer for updating.

In some embodiments, additional portions of user data to be written in the first dimension (i.e., the row dimension) are received. For each additional portion of user data, at least some of the partial column parity values are iteratively updated, for each additional portion. When all the user data is received, the parity values that are stored in the partial column parity buffer may be stored as the column parity symbols, or the second parity symbols.

At 908, the user data, the first parity symbols, and the second parity symbols are stored in the non-volatile storage device. In an example, the user data, the first parity symbols, and the second parity symbols are stored in a storage unit in a matrix form in accordance with the example shown in FIG. 3.

FIG. 10 is a high level flow diagram of a process 1000 for decoding data stored on a non-volatile storage device. The data is encoded using a product code having a first dimension and a second dimension and may be stored on the non-volatile storage device in accordance with process 900 described in relation to FIG. 9. Process 1000 includes retrieving data encoded using a product code having a first dimension and a second dimension (1002) and decoding a first codeword in the first dimension (1004). When the decoding the first codeword in the first dimension is successful, a target syndrome of a second codeword in the second dimension is computed based on a result of the decoding of the first codeword, wherein the first codeword partially overlaps with the second codeword (1006).

At 1002, data encoded using a product code having a first dimension and a second dimension is retrieved. In particular, the encoded data may be encoded by an encoding process such as the process described in relation to FIG. 4 or 9. At 1004, a first codeword in the first dimension is decoded. The first codeword may be a row codeword in the row dimension of the product code, and decoding the row codeword may involve implementing an LDPC decoding process.

At 1006, when the decoding the first codeword in the first dimension is successful, a target syndrome of a second codeword in the second dimension is computed based on a result of the decoding of the first codeword. The first codeword partially overlaps with the second codeword. In particular, the first codeword (in the row dimension) and the second codeword (in the column dimension) intersect in a matrix such as that shown in FIG. 3 and therefore share at least one symbol value. When the decoding of the row codeword at 1004 is successful, the target syndrome of a column codeword is computed based on the result of the successful decoding. In particular, as described in relation to FIG. 8, the corresponding one or more portions of the parity check matrix for the column code (corresponding to successfully decoded row codewords) are removed from the parity check matrix, and a target syndrome (also referred to as a coset syndrome or a partial syndrome) is computed.

As is described herein, a target syndrome refers to an expected syndrome when decoding is successful. In particular, the target syndrome is typically a zero vector for standard decoding. However, in accordance with the present disclosure, the target syndrome in one dimension (i.e., the column dimension) may be updated as successful decoding occurs in another dimension (i.e., the row dimension). In an example, when row decoding of a row codeword is successful, the values are known for one or more overlapping symbols that are shared between the row codeword and a column codeword. In this case, the decoding of the column codeword may be simplified by removing or pruning the portion of the parity check matrix of the column codeword that corresponds to the known overlapping symbols. Because one or more portions of the parity check matrix have been removed, the target syndrome needs to be also accordingly updated to reflect the changes in the parity check matrix. Because the target syndrome is representative of only a portion of the original parity check matrix, the target syndrome may also be referred to as a partial syndrome. Effectively, the result of removing one or more portions of the parity check matrix is that the decoding of the column codeword is performed partially given that there is a known part (the known overlapping symbols) and that the known part is conceptually replaced by the hard decisions obtained as a result of the successful decoding of the row codeword. These hard decisions are effectively folded into the target syndrome.

The foregoing describes methods and systems for encoding and decoding user data using product codes for storing data to a non-volatile storage device. The above-described embodiments of the present disclosure are presented for the purposes of illustration and not of limitation. Furthermore, the present disclosure is not limited to a particular implementation. For example, one or more steps of methods described above may be performed in a different order (or concurrently) and still achieve desirable results. In addition, the disclosure may be implemented in hardware, such as on an application-specific integrated circuit (ASIC) or on a field-programmable gate array (FPGA). The disclosure may also be implemented in software.

What is claimed is:

1. A method for encoding data to be stored on a storage device using a product code having a first dimension and a second dimension, comprising:
receiving a portion of user data to be written in the first dimension, wherein the first dimension is a row dimension or a column dimension, and the portion of user data is a portion of a row or a portion of a column;

computing first parity symbols for the portion of user data, wherein the first parity symbols are with respect to the first dimension;

computing partial parity symbols for the portion of user data, wherein the partial parity symbols are with respect to the second dimension and are used to obtain second parity symbols for the portion of user data; and storing the user data, the first parity symbols, and the second parity symbols in the storage device.

2. The method of claim 1, further comprising:

receiving additional portions of user data to be written in the first dimension; and iteratively updating, for each additional portion, at least some of the partial parity symbols using the second dimension of the product code.

3. The method of claim 1, wherein the first dimension is the row dimension, the second dimension is the column dimension, and the portion of user data is a portion of a row of user data.

4. The method of claim 1, further comprising computing additional first parity symbols in the first dimension for obtaining the second parity symbols.

5. The method of claim 1, wherein the product code in the first dimension is an LDPC code, the product code in the second dimension is an LDPC code, and the same encoding circuitry is used to compute the first parity symbols and the partial parity symbols.

6. A method for decoding data stored on a storage device, comprising:

retrieving data encoded using a product code having a first dimension and a second dimension;

decoding a first codeword in the first dimension; and when the decoding the first codeword in the first dimension is successful, computing a target syndrome of a second codeword in the second dimension based on a result of the decoding of the first codeword by removing a portion of a parity check matrix for the product code in the second dimension, wherein the first codeword partially overlaps with the second codeword.

7. The method of claim 6, wherein a result of the decoding of the first codeword is a hard decision associated with the decoding.

8. The method of claim 6, wherein a parity check matrix for the product code in the second dimension has similar degrees for different portions of the parity check matrix.

9. The method of claim 6, wherein a coding circuitry performs the decoding of the first codeword and computes the target syndrome of the second codeword in the second dimension.

10. An encoder for encoding data using a product code having a first dimension and a second dimension, the encoder comprising circuitry configured to:

receive a portion of user data to be written in the first dimension, wherein the first dimension is a row dimension or a column dimension, and the portion of user data is a portion of a row or a portion of a column;

compute first parity symbols for the portion of user data, wherein the first parity symbols are with respect to the first dimension;

compute partial parity symbols for the portion of user data, wherein the partial parity symbols are with respect to the second dimension and are used to obtain second parity symbols for the portion of user data; and store the user data, the first parity symbols, and the second parity symbols in a storage device.

11. The encoder of claim 10, wherein the circuitry is further configured to:

receive additional portions of user data to be written in the first dimension; and iteratively update, for each additional portion, at least some of the partial parity symbols using the second dimension of the product code.

12. The encoder of claim 10, wherein the first dimension is the row dimension, the second dimension is the column dimension, and the portion of user data is a portion of a row of user data.

13. The encoder of claim 10, wherein the circuitry is further configured to compute additional first parity symbols in the first dimension to obtain the second parity symbols.

14. The encoder of claim 10, wherein the product code in the first dimension is an LDPC code, and the product code in the second dimension is an LDPC code.

15. A decoder for decoding data stored on a storage device, the decoder comprising circuitry configured to:

retrieve data encoded using a product code having a first dimension and a second dimension;

decode a first codeword in the first dimension; and when the circuitry successfully decodes the first codeword in the first dimension, the circuitry is further configured to compute a target syndrome of a second codeword in the second dimension based on a result of the decoding of the first codeword by removing a portion of a parity check matrix for the product code in the second dimension, wherein the first codeword partially overlaps with the second codeword.

16. The decoder of claim 15, wherein a result of the decoding of the first codeword is a hard decision associated with the decoding.

17. The decoder of claim 15, wherein a parity check matrix for the product code in the second dimension has similar degrees for different portions of the parity check matrix, or has a number of short cycles within different portions of the parity check matrix to be below a threshold.

18. The decoder of claim 15, wherein a decoding circuitry module to decode the first codeword is the same as the decoding circuitry module to compute the target syndrome of the second codeword.

* * * * *